(12) United States Patent
Abraham et al.

(10) Patent No.: US 11,804,442 B2
(45) Date of Patent: Oct. 31, 2023

(54) COMBINED BACKING PLATE AND HOUSING FOR USE IN BUMP BONDED CHIP ASSEMBLY

(71) Applicant: International Business Machines Corporation, Armonk, NY (US)

(72) Inventors: David Abraham, Croton, NY (US); John Michael Cotte, New Fairfield, CT (US); Shawn Anthony Hall, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/192,542

(22) Filed: Mar. 29, 2023

(65) Prior Publication Data

US 2023/0230927 A1 Jul. 20, 2023

Related U.S. Application Data

(63) Continuation of application No. 16/998,451, filed on Aug. 20, 2020, now Pat. No. 11,676,903.

(51) Int. Cl.
*H01L 23/538* (2006.01)
*H01L 23/00* (2006.01)

(52) U.S. Cl.
CPC ...... *H01L 23/5385* (2013.01); *H01L 23/5384* (2013.01); *H01L 23/5386* (2013.01); *H01L 24/14* (2013.01)

(58) Field of Classification Search
CPC ............. H01L 23/5385; H01L 23/5384; H01L 23/5386
See application file for complete search history.

(56) References Cited

U.S. PATENT DOCUMENTS

| 5,073,521 A | 12/1991 | Braden |
| 5,455,387 A | 10/1995 | Hoffman et al. |
| 8,241,968 B2 | 8/2012 | Lee et al. |
| 9,666,934 B2 | 5/2017 | Lombardi et al. |
| 2005/0258212 A1 | 11/2005 | Costello |
| 2013/0196855 A1 | 8/2013 | Poletto et al. |
| 2017/0025393 A1 | 1/2017 | Lin et al. |

(Continued)

FOREIGN PATENT DOCUMENTS

| CN | 205566824 U | 9/2016 |
| CN | 206834139 U | 1/2018 |
| CN | 110286520 A | 9/2019 |

OTHER PUBLICATIONS

Rosenberg et al., "CWDM Transceiver for Mid-Board Optics", Proceedings of the SPIE, vol. 10109, Feb. 2017, 2 pages.

(Continued)

*Primary Examiner* — Errol V Fernandes
(74) *Attorney, Agent, or Firm* — Amin, Turocy & Watson, LLP

(57) ABSTRACT

A method for forming an electronic chip assembly. A first metal plate is coupled to a first side of a substrate to form a backing plate. A first cavity is created extending through the substrate to extend at least to the first metal plate. An electronic component is bonded to the substrate such that the electronic component is located within the first cavity. A second metal plate, having a second cavity, is disposed to a second side of the substrate, and over the first cavity such that the electronic component is encased within the first and second cavities by the first and second metal plates.

20 Claims, 3 Drawing Sheets

(56) References Cited

U.S. PATENT DOCUMENTS

| | | |
|---|---|---|
| 2017/0062394 A1 | 3/2017 | Lin et al. |
| 2019/0221520 A1 | 7/2019 | Kim et al. |
| 2019/0380234 A1 | 12/2019 | Grober et al. |
| 2020/0100357 A1 | 3/2020 | Olivadese et al. |
| 2020/0111720 A1 | 4/2020 | Wan et al. |
| 2020/0259064 A1 | 8/2020 | Lewandowski et al. |

OTHER PUBLICATIONS

Buckhanan, W. L., "Wideband Chip-to-Chip Interconnects for High Performance Computing", UMI, Apr. 2013, 155 pages.
International Search Report and Written Opinion received for PCT Application Serial No. PCT/EP2021/072656 dated Mar. 15, 2023, 7 pages.
Non-Final Office Action received for U.S. Appl. No. 16/998,451, dated Sep. 29, 2023, 39 pages.
Notice of Allowance received for U.S. Appl. No. 16/998,451, dated Jan. 25, 2023, 32 pages.
List of IBM Patents or Applications Treated as Related (Appendix P), 2 pages.

COMBINED BACKING PLATE AND HOUSING FOR USE IN BUMP BONDED CHIP ASSEMBLY

BACKGROUND

The currently claimed embodiments of the present invention relate to an electronic chip assembly and corresponding method.

Quantum computers often include quantum bits (qubits) formed as part of a quantum qubit chip of a quantum component. The quantum chip may be part of a quantum chip assembly, where the quantum qubit chip is bonded to a quantum interposer chip, which in turn is bonded to a printed circuit board (PCB), The assembly may have metal plates, known as "pennies" attached to opposing surfaces of the PCB, which encase the quantum chip within a microwave cavity defined by the pennies.

In forming the quantum chip assembly, the two pennies are placed adjacent the quantum chip and are attached to the PCB on opposing surfaces of the PCB. The quantum chip is disposed within a hole formed into the PCB. In fabrication, first the quantum qubit chip is indium-bump-bonded to the quantum interposer chip, and the quantum interposer chip is then bonded to the PCB. During this procedure a metal backing plate is screwed to the PCB in order to provide a flat and stable surface to allow the bonding to be done accurately and reproducibly. Once the quantum interposer chip is bonded to the PCB, the metal backing plate is removed, and then the two pennies are bonded to the PCB.

SUMMARY

An aspect of the presently claimed invention is to provide a method for forming an electronic chip assembly. A first metal plate is coupled to a first side of a substrate to form a backing plate. A first cavity is created extending through the substrate to extend at least to the first metal plate. An electronic component is bonded to the substrate such that the electronic component is located within the first cavity. A second metal plate, having a second cavity, is disposed to a second side of the substrate, and over the first cavity such that the electronic component is encased within the first and second cavities by the first and second metal plates.

According to some embodiments, the creating a first cavity creates the first cavity into the first metal plate. According to some embodiments, the first cavity and the second cavity form an electromagnetic resonance chamber having a wavelength cutoff to exclude electromagnetic radiation with wavelengths below the wavelength cutoff. According to some embodiments, the electronic component comprises a quantum qubit chip and a quantum interposer chip bonded to the quantum qubit chip, and wherein the quantum interposer chip is bonded to the substrate. According to some embodiments, the bonding the quantum interposer chip to the substrate is performed after the coupling the first metal plate to the first side of the substrate.

According to some embodiments, the substrate is one of a printed circuit board (PCB) or a laminate. According to some embodiments, the first and second metal plates comprise aluminum or copper. According to some embodiments, upon the electronic component being encased by the first and second metal plates within the first and second cavities, the electronic component is separated from the first and second metal plates by an insulator. According to some embodiments, the insulator is a gas or a vacuum.

According to some embodiments, the coupling the first metal plate to the first side of the substrate, comprises forming a seal between the first metal plate and the substrate. According to some embodiments, the seal comprises an indium seal. According to some embodiments, the seal is formed in a groove in at least one of the first metal plate or the substrate. According to some embodiments, the first cavity has a same or smaller cross-section in the substrate than in the first metal plate.

Another aspect of the presently claimed invention is to provide a method for forming an electronic chip assembly. A first metal plate is coupled to a first side of a substrate to form a backing plate. A first cavity is created extending through the substrate to extend at least to the first metal plate. A plurality of electronic components is bonded, each electronic component comprising a quantum interposer chip and a quantum qubit chip, to the substrate such that the quantum qubit chips are located within the first cavity. A second metal plate, having a second cavity, is disposed to a second side of the substrate, and over the first cavity such that electronic components are encased within the first and second cavities by the first and second metal plates.

According to some embodiments the creating a first cavity creates the first cavity to extend into the first metal plate.

Another aspect of the presently claimed invention is to provide an electronic chip assembly, comprising a substrate. A first metal plate is located on a first side of the substrate to form a backing plate, wherein a first cavity extends through the substrate and into the first metal plate. At least one electronic component is located within the first cavity. A second metal plate, having a second cavity, is disposed over the first cavity such that the at least one electronic component is encased within the first and second cavities by the first and second metal plates.

According to some embodiments, the at least one electronic component comprises a plurality of electronic components. According to some embodiments, the first cavity has a same or smaller cross-section in the substrate than in the first metal plate. According to some embodiments, each at least one electronic component comprises a quantum interposer chip and a quantum qubit chip bonded to the quantum interposer chip.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

According to some embodiments, instead of using a separate backing plate on a substrate for bonding of a quantum interposer chip to the substrate, and then removing the backing plate, and disposing pennies to form a microwave cavity for the quantum chip, the backing plate is not removed. Instead, a single plate is used both for the backing plate and as one of the pennies. According to some embodiments, the single backing plate may have an appropriate cutout for the quantum qubit chip, where the plate cutout forms a cavity, which is part of the overall cavity formed by the pennies. Thus, the single backing plate is used both as a backing plate and as a penny. This has the advantage, in some embodiments, of preventing the substrate from warping after fabrication, and reduces handling. The net benefit is increased reliability of the substrate-to-interposer bump bonds in some embodiments.

Figure 1:
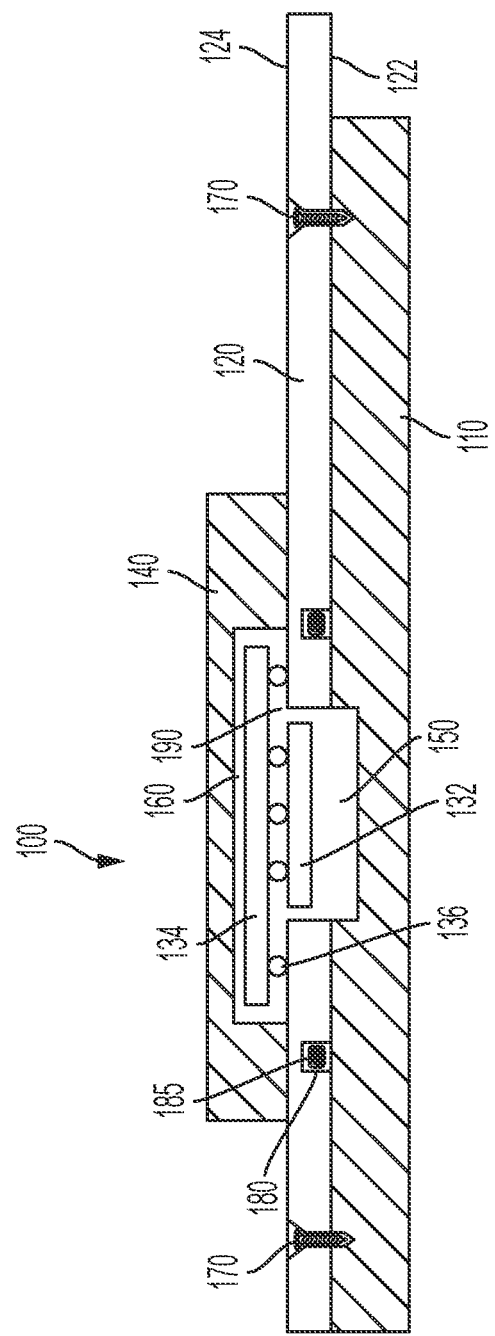
FIG. 1 is a schematic of an electronic chip assembly, according to some embodiments.

FIG. 1 is a schematic of an electronic chip assembly 100, according to some embodiments. The electronic chip assembly 100 includes a substrate 120. The substrate 120 may be a PCB and/or a laminate, and may be formed of a resin material, for example.

The electronic chip assembly 100 may further include a first metal plate 110 disposed on a first side 122 of the substrate 120 to function as a backing plate. The first metal plate 110 may be attached to the substrate 120 via screws 170. The electronic chip assembly 100 may include grooves 180 in the substrate 120 and/or first metal plate 110. The grooves 180 may be filled with a sealing material 185, such as In for example, to provide a seal between the first metal plate 110 and the substrate 120.

A first cavity 150 extends through the substrate 120 at least up to the first metal plate 110. In some embodiments the first cavity 150 extends into the first metal plate 110.

The first cavity 150, in some embodiments, may have a same or smaller cross-section in the substrate 120 than in the first metal plate 110. In this way the portion of the first cavity 150 in the first metal plate 110 does not undercut the substrate 120, and thus provides improved stability when bonding material to the substrate 120.

In some embodiments, the electronic chip assembly 100 may include at least one electronic component 130. The at least one electronic component 130 is disposed within the first cavity 150. Each of the at least one electronic components 130 may be a quantum interposer chip 134 and/or a quantum qubit chip 132. Each of the at least one electronic components 130 may include a quantum interposer chip 134 and a quantum qubit chip 132, having a qubit or qubits, coupled to the quantum interposer chip 134. The quantum qubit chip 132 may be bonded to the quantum interposer chip 134 via bump bonds 136, for example. The quantum interposer chip 134 may also be bonded to the substrate 120 via bump bonds 136, for example. The bump bonds 136 may be formed of an In containing material, for example. In some embodiments the quantum qubit chip 132 may be bonded directly to the substrate 120, for example if the electronic component 130 does not include a quantum interposer chip 134.

The electronic chip assembly 100 may include a second metal plate 140. The second metal plate 140 may have a second cavity 160 disposed over the first cavity 150 such that the at least one electronic component 130 is encased within the first and second cavities (150, 160) by the first and second metal plates (110, 140). The first and second metal plates (110, 140) may be formed of aluminum or copper, for example.

The first and second cavities (150, 160) together form an overall cavity which acts as a microwave cavity, wherein the size of the overall cavity determines the wavelength of microwaves resonant within the overall cavity. The first cavity 150 and the second cavity 160 may form an electromagnetic resonance chamber having a wavelength cutoff to exclude wavelengths below the wavelength cutoff. Not that by enclosing the device using a bottom and top plate (which form together a sealed cavity) then most if not all external radiation is excluded, but not by the cutoff mechanism.

Figure 2A:
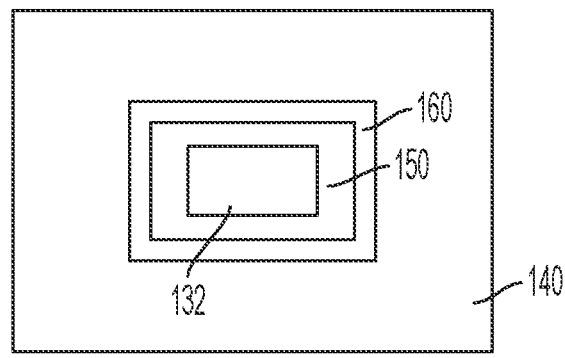
FIG. 2A is a schematic diagram illustrating a top view of an electronic chip assembly with a single electronic component in a cavity according to some embodiments.

FIG. 1 illustrates an embodiment where a single electronic component 130 is encased within the first and second cavities (150, 160). FIG. 2A is a top schematic view illustrating an embodiment where a quantum qubit chip 132 of a single electronic component 130 is encased within the first and second cavities (150, 160). Alternatively, as shown in the top schematic view of FIG. 2B, more than one quantum qubit chip 132 may be encased within the first and second cavities (150, 160).

Figure 3A:
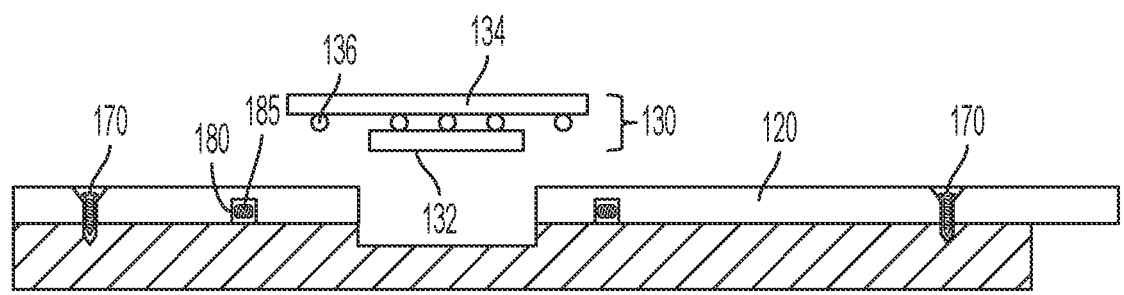
FIGS. 3A, 3B and 3C illustrate a process flow of a method for forming an electronic chip assembly according to some embodiments.
Figure 3B:
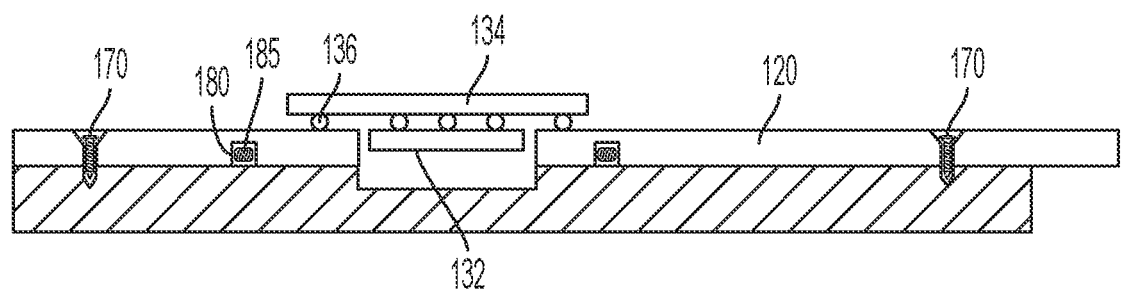
Figure 3C:
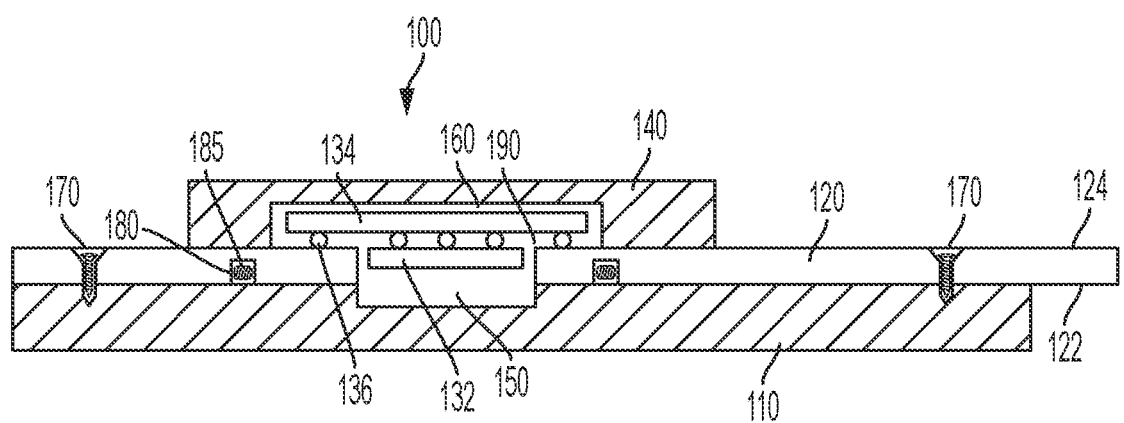

FIGS. 3A, 3B and 3C illustrate a process flow of a method for forming an electronic chip assembly, such as the electronic chip assembly 100 of FIG. 1, according to some embodiments.

As shown in FIG. 3A, a first metal plate 110 is attached to a first side 122 of a substrate 120 to form a backing plate on the substrate 120. The first metal plate 110 may be formed of aluminum or copper, for example. The first metal plate 110 may be formed to have a flat surface on both sides. The flatness of the first metal plate 110 surfaces may be sufficient such that the bonding of the electronic component 130 to the substrate 120 is improved. In some embodiments, the first metal plate 110 may be attached to the substrate 120 such that there are no gaps between the first metal plate 110 and the substrate 120. In some embodiments the flat surfaces of the first metal plate 110 may be precision ground.

The substrate 120 may be formed of a resin and/or a laminate material, and may be a PCB. The first metal plate 110 may be attached to the first side 122 of the substrate 120 via screws 170, for example, or pins.

As shown in FIG. 3A, a first cavity 150 is created extending through the substrate 120 to extend at least to the first metal plate 110. The first cavity 150 may be formed through the substrate 120 by chemical etching, or by a mechanical process such as cutting or punching, for example. The first cavity 150 may be formed to extend into the first metal plate 110. For example, the first cavity 150 may be formed to extend into the first metal plate 110 by chemical etching, or by a mechanical process, for example.

The first cavity 150, in some embodiments, may be formed to have a same or smaller cross-section in the substrate 120 than in the first metal plate 110. In this way the portion of the first cavity 150 in the first metal plate 110 does not undercut the substrate 120, and thus provides improved stability during the bonding process of the electronic component 130 to the second surface 124 of the substrate 120.

The attachment of the first metal plate 110 to the first side 122 of the substrate 120, according to some embodiments, may include forming a seal between the first metal plate 110 and the substrate 120. The seal may be formed by forming a seal material 185 into a groove 180, which is formed in one of the first metal plate 110 and the substrate 120. The seal material 185 may include In, for example.

As shown in FIG. 3B, the electronic component 130 is then bonded to the second surface 124 of the substrate 120. The electronic component 130 may include a quantum interposer chip 134 and a quantum qubit chip 132. The quantum interposer chip 134 and the quantum qubit chip 132 may be formed of different or the same materials. For example, the quantum interposer chip 134 and the quantum qubit chip 132 may both be formed of a semiconductor material. The quantum qubit chip 132 may have one or more qubits formed thereon. The quantum interposer chip 134, according to some embodiments, may have one or more microwave generating structures formed thereon to generate microwaves at desired wavelengths.

As shown in FIG. 3B, the quantum interposer chip 134 is attached to the quantum qubit chip 132. According to some embodiments, the quantum interposer chip 134 may be attached to the quantum qubit chip 132 by a bonding process. For example, the quantum interposer chip 134 may be bonded to the quantum qubit chip 132 via bump bonds 136. In this case the bump bonds 136 may be heated such that the bump bonds 136 bond the quantum interposer chip 134 to the quantum qubit chip 132.

As shown in FIG. 3A, the quantum interposer chip 134 is attached to the substrate 120. According to some embodiments, the quantum interposer chip 134 may be attached to the substrate 120 by a bonding process. For example, the quantum interposer chip 134 may be bonded to the substrate 120 via bump bonds 136. In this case the bump bonds 136 may be heated such that the bump bonds 136 bond the quantum interposer chip 134 to the substrate 120. According to some embodiments, the quantum interposer chip 134 may be bonded to the quantum qubit chip 132 before the quantum interposer chip 134 is bonded to the substrate 120.

As shown in FIG. 3C, a second metal plate 140, having a second cavity 160, is disposed to a second side of the substrate 120, and over the first cavity 150 such that the quantum interposer chip 134 and the quantum qubit chip 132 are encased within the first and second cavities (150, 160) by the first and second metal plates (110, 140). Upon the quantum interposer chip 134 and the quantum qubit chip 132 being encased by the first and second metal plates (110, 140) within the first and second cavities (150, 160), the quantum interposer chip 134 and the quantum qubit chip 132 may be separated from the first and second metal plates (110, 140) by an insulator 190. The 190 insulator may be a gas or a vacuum, for example.

The second metal plate 140 may be attached to the substrate 120. For example, the second metal plate 140 may be attached to the substrate 120 using screws, for example. Indium gasket may also be used in attaching the first metal plate 110 and/or the second metal plate 140 to the substrate 120.

Figure 2B:
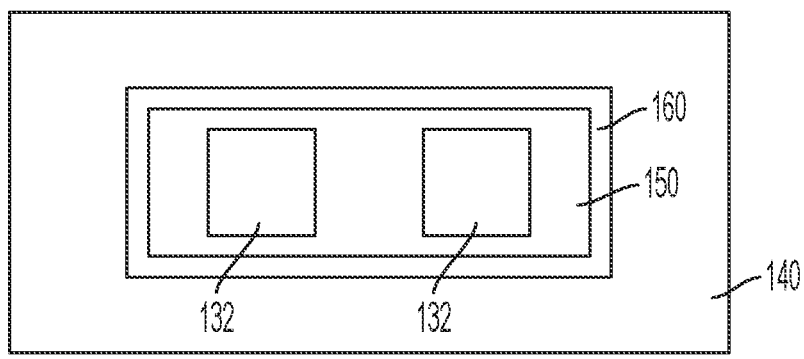
FIG. 2B is a schematic diagram illustrating a top view of an electronic chip assembly with multiple electronic components in a cavity according to some embodiments.

FIG. 3C illustrates a single electronic component 130 encased within the first and second cavities (150, 160) by the first and second metal plates (110, 140). Alternatively, a plurality of electronic components 130 may be encased within the first and second cavities (150, 160) by the first and second metal plates (110, 140), such as shown in FIG. 2B.

The above described device and methods provide many benefits according to some embodiments. A single backing plate is used both as a backing plate and as a penny. This has the advantage, in some embodiments, of preventing the substrate from warping after fabrication, and reduces handling. The net benefit is increased reliability of the substrate-to-interposer bump bonds in some embodiments.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. An electronic chip assembly, comprising:
a first metal plate attached to a first side of a substrate and comprising a first cavity, wherein the first cavity extends through the substrate and into the first metal plate;
a second metal plate attached to a second side of the substrate and comprising a second cavity, wherein the second cavity is disposed over the first cavity such that the first cavity and the second cavity form an overall cavity which acts as a microwave cavity, wherein a size of the overall cavity determines a wavelength of microwaves resonant within the microwave cavity; and
one or more electronic components encased by the first cavity and the second cavity, wherein the one or more electronic components comprise a quantum interposer chip comprising one or more microwave generating structures that generate microwaves at desired wavelengths.

2. The electronic chip assembly of claim 1, wherein the substrate is one of a printed circuit board (PCB) or a laminate.

3. The electronic chip assembly of claim 1, wherein the first metal plate and the second metal plate comprise aluminum or copper.

4. The electronic chip assembly of claim 1, wherein the first cavity has a same or smaller cross-section in the substrate than in the first metal plate.

5. The electronic chip assembly of claim 1, wherein the first cavity and the second cavity form an electromagnetic resonance chamber having a wavelength cutoff to exclude electromagnetic radiation with wavelengths below the wavelength cutoff.

6. The electronic chip assembly of claim 1, wherein the quantum interposer chip is bonded to the substrate via bump bonds.

7. The electronic chip assembly of claim 1, wherein the one or more electronic components further comprise a quantum qubit chip having one or more qubits, wherein the quantum qubit chip is bonded to the quantum interposer chip via bump bonds.

8. The electronic chip assembly of claim 7, wherein the quantum interposer chip and the quantum qubit chip are formed of a semiconductor material.

9. A method, comprising:
forming an electronic chip assembly, wherein the forming the electronic chip assembly comprises:
attaching, a first metal plate to a first side of a substrate, wherein the first metal plate comprises a first cavity, and wherein the first cavity extends through the substrate and into the first metal plate;
attaching, a second metal plate to a second side of the substrate, wherein the second metal plate comprises a second cavity, wherein the second cavity is disposed over the first cavity such that the first cavity and the second cavity form an overall cavity which acts as a microwave cavity, and wherein a size of the overall cavity determines a wavelength of microwaves resonant within the microwave cavity; and encasing, one or more electronic components by the first cavity and the second cavity, wherein the one or more electronic components comprise a quantum interposer chip comprising one or more microwave generating structures that generate microwaves at desired wavelengths.

10. The method of claim 9, wherein the substrate is one of a printed circuit board (PCB) or a laminate.

11. The method of claim 9, wherein the first metal plate and the second metal plate comprise aluminum or copper.

12. The method of claim 9, wherein the first cavity has a same or smaller cross-section in the substrate than in the first metal plate.

13. The method of claim 9, wherein the first cavity and the second cavity form an electromagnetic resonance chamber having a wavelength cutoff to exclude electromagnetic radiation with wavelengths below the wavelength cutoff.

14. The method of claim 9, wherein the quantum interposer chip is bonded to the substrate via bump bonds, wherein the bump bonds are heated to bond the quantum interposer chip to the substrate.

15. The method of claim 9, wherein the one or more electronic components further comprise a quantum qubit chip having one or more qubits, and wherein the quantum interposer chip is bonded to the quantum qubit chip via bump bonds, wherein the bump bonds are heated to bond the quantum interposer chip to the quantum qubit chip.

16. The method of claim 15, wherein the quantum interposer chip and the quantum qubit chip are formed of a semiconductor material.

17. A method, comprising:
forming an electronic chip assembly, wherein the forming the electronic chip assembly comprises:
attaching, a first metal plate to a first side of a substrate, wherein the first metal plate functions as a backing plate, wherein the first metal plate comprises a first cavity, and wherein the first cavity extends through the substrate and into the first metal plate;
attaching, a second metal plate to a second side of the substrate, wherein the second metal plate comprises a second cavity, and wherein the second cavity is disposed over the first cavity; and
encasing, one or more electronic components by the first cavity and the second cavity, wherein the one or more electronic components comprise a quantum qubit chip directly bonded to the substrate, and wherein the first cavity and the second cavity form an electromagnetic resonance chamber having a wavelength cutoff to exclude electromagnetic radiation with wavelengths below the wavelength cutoff.

18. The method of claim 17, wherein the substrate is one of a printed circuit board (PCB) or a laminate.

19. The method of claim 17, wherein the first metal plate and the second metal plate comprise aluminum or copper.

20. The method of claim 17, wherein an Indium gasket is used for attaching at least one of the first metal plate or the second metal plate to the substrate.

\* \* \* \* \*